(12) United States Patent
Lu et al.

(10) Patent No.: US 10,867,928 B2
(45) Date of Patent: Dec. 15, 2020

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Kuan-Chung Lu, Hsinchu (TW); An-Jhih Su, Taoyuan (TW); Der-Chyang Yeh, Hsin-Chu (TW); Li-Hsien Huang, Hsinchu County (TW); Yueh-Ting Lin, Taipei (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/365,611

(22) Filed: Mar. 26, 2019

(65) Prior Publication Data

US 2020/0043855 A1 Feb. 6, 2020

Related U.S. Application Data

(60) Provisional application No. 62/712,228, filed on Jul. 31, 2018.

(51) Int. Cl.
*H01L 23/538* (2006.01)
*H01L 25/00* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 24/19* (2013.01); *H01L 24/20* (2013.01);
(Continued)

(58) Field of Classification Search
CPC ............ H01L 23/5389; H01L 23/5383; H01L 23/5386; H01L 21/4853; H01L 21/4857; H01L 21/565; H01L 24/19; H01L 24/20; H01L 25/0657; H01L 25/105; H01L 25/50
See application file for complete search history.

(56) References Cited

U.S. PATENT DOCUMENTS

2010/0072600 A1* 3/2010 Gerber ................. H01L 25/105
257/686
2017/0178988 A1* 6/2017 Cheney ............ H01L 23/49838

* cited by examiner

*Primary Examiner* — Seahvosh Nikmanesh
(74) *Attorney, Agent, or Firm* — JCIPRNET

(57) ABSTRACT

A semiconductor device and the manufacturing method thereof are provided. The semiconductor device includes a package structure, a first die, a first containment structure, a pre-fill layer, and a plurality of conductive terminals. The package structure includes an attach zone, a keep-out zone around the attach zone. The first die is disposed on the package structure in the attach zone and electrically connected to the package structure. The first containment structure is disposed within the keep-out zone of the package structure and surrounds the first die. The pre-fill layer is disposed between the package structure and the first die and between the first containment structure and the first die, where the pre-fill layer is constrained within the first containment structure. The conductive terminals are disposed on the package structure, distributed around the keep-out zone of the package structure, and electrically connected to the package structure.

13 Claims, 15 Drawing Sheets

(51) Int. Cl.
*H01L 23/31* (2006.01)
*H01L 23/00* (2006.01)
*H01L 25/065* (2006.01)
*H01L 25/10* (2006.01)
*H01L 21/48* (2006.01)
*H01L 21/56* (2006.01)

(52) U.S. Cl.
CPC ........ *H01L 25/0657* (2013.01); *H01L 25/105* (2013.01); *H01L 25/50* (2013.01); *H01L 2224/214* (2013.01); *H01L 2225/06524* (2013.01); *H01L 2225/06558* (2013.01); *H01L 2225/06586* (2013.01); *H01L 2225/1035* (2013.01); *H01L 2225/1058* (2013.01)

SEMICONDUCTOR DEVICE AND MANUFACTURING METHOD THEREOF

CROSS-REFERENCE TO RELATED APPLICATION

This application claims the priority benefit of U.S. provisional application Ser. No. 62/712,228, filed on Jul. 31, 2018. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages. Examples of the type of device packages for semiconductors include three-dimensional integrated circuits (3DICs), wafer level packages (WLPs), and package on package (PoP) devices, etc. Some semiconductor devices are prepared by placing chips over chips on a semiconductor wafer level. The semiconductor devices provide improved integration density and other advantages, such as faster speeds and higher bandwidth, because of the decreased length of interconnects between the stacked chips. However, there are many challenges related to semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
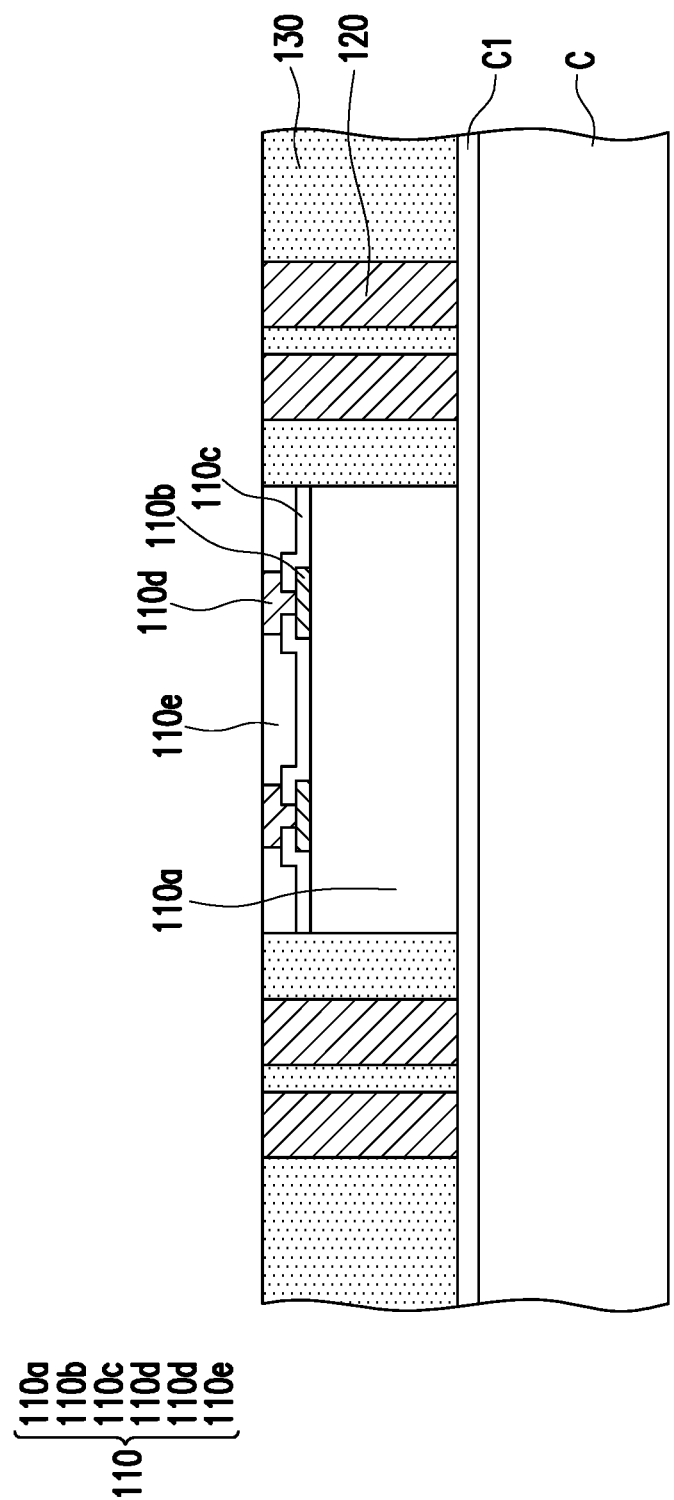
FIG. 1 and FIG. 2 are schematic cross-sectional views showing various stages in a manufacturing method of a semiconductor structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
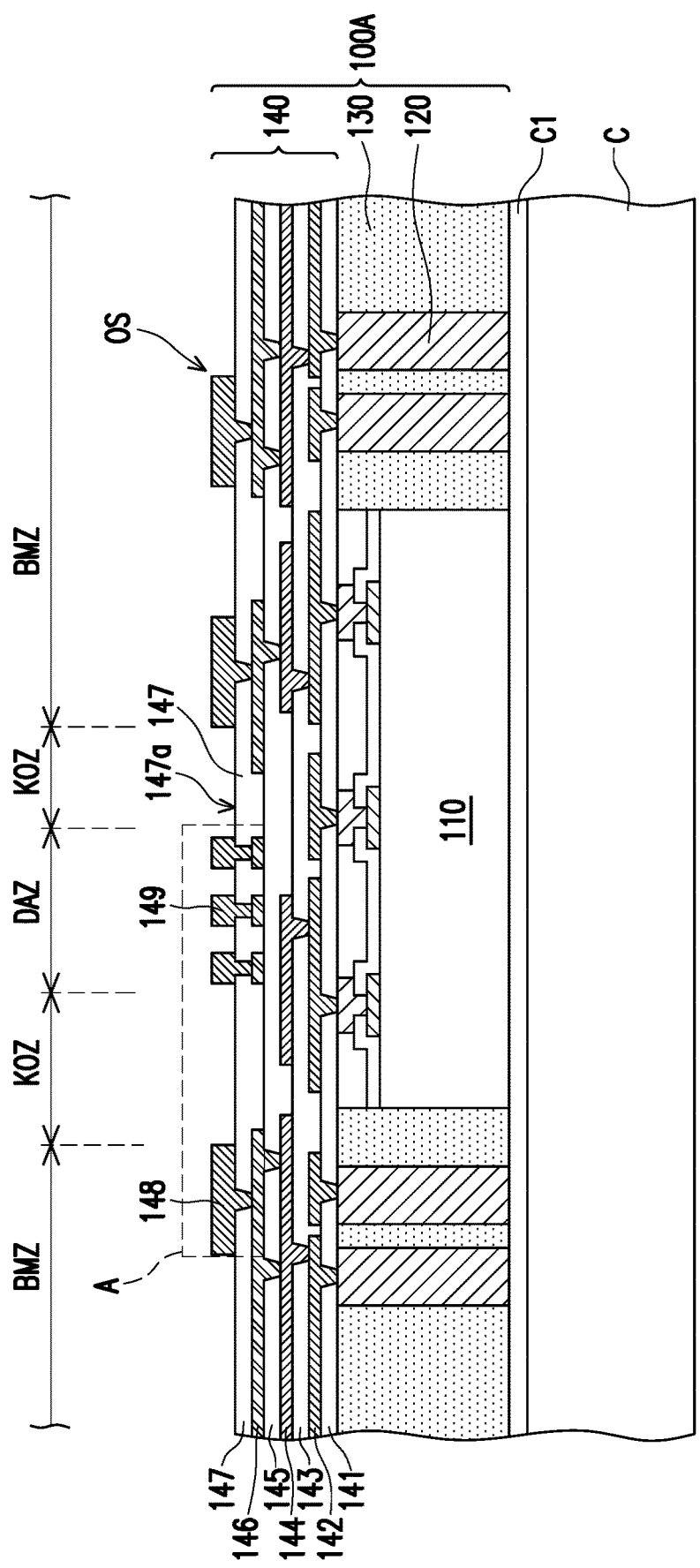

FIG. 1 and FIG. 2 are schematic cross-sectional views showing various stages in a manufacturing method of a semiconductor structure according to some exemplary embodiments of the present disclosure. In exemplary embodiments, the manufacturing method is part of a wafer level packaging process. One or more types of integrated circuit dies may be packaged in a semiconductor structure to form, for example, a system on a chip (SoC) device. Referring to FIG. 1, a temporary carrier C is provided and a first semiconductor die 110 and a plurality of conductive elements 120 aside the first semiconductor die 110 are provided on the temporary carrier C. In some embodiments, a de-bonding layer C1 is formed on the temporary carrier C. The temporary carrier C may be a glass carrier, a ceramic carrier, or the like. The de-bonding layer C1 may be formed of a polymer-based material (e.g., a light to heat conversion (LTHC) material), which may be removed along with temporary carrier C from the overlying structures that will be formed in subsequent processes. In some embodiments, more than one semiconductor dies are disposed on the temporary carrier C. For example, the first semiconductor die 110 includes one or more types of chip(s) selected from digital chips, analog chips or mixed signal chips, application-specific integrated circuit (ASIC) chips, sensor chips, memory chips, or logic chips, and/or other electronic devices.

In some embodiments, the first semiconductor die 110 includes a semiconductor substrate 110a, contact pads 110b over the semiconductor substrate 110a, a passivation layer 110c over the semiconductor substrate 110a and exposing portions of the contact pads 110b, die connectors 110d over the passivation layer 110c and electrically connected to the contact pads 110b, and a protection layer 110e over the passivation layer 110c and aside the die connectors 110d. In some embodiments, the die connectors 110d include conductive pillars or vias, solder bumps, gold bumps, copper posts, or the like, and are formed by an electroplating process or other suitable deposition process. The surface on which die connectors 110d are distributed for further electrical connection may be referred to as the active surface of the first semiconductor die 110. In some embodiments, the protection layer 110e includes polybenzoxazole (PBO), polyimide (PI), a suitable organic or inorganic material, or the like. In some embodiments, the conductive elements 120 are formed on the temporary carrier C before the first semiconductor die 110 is picked and placed on the temporary carrier C. In alternative embodiments, the conductive elements 120 are provided on the temporary carrier C after the first semiconductor die 110 is picked and placed on the temporary carrier C. A material of the conductive elements 120 includes copper, nickel, solder, a combination thereof, or the like. In some embodiments, the conductive elements 120 are formed by an electroplating process or other suitable deposition process. In some alternative embodiments, the conductive elements 120 are omitted. It is appreciated that the number and the position of the conductive elements 120 are variable and can be modified on demand.

Continue referring to FIG. 1, an insulating encapsulation 130 is formed over the temporary carrier C to laterally encapsulate the first semiconductor die 110 and the conductive elements 120. The insulating encapsulation 130 may expose the top surfaces of the conductive elements 120 and the die connectors 110d of the first semiconductor die 110 for further electrical connection. The insulating encapsulation 130 includes a molding compound (e.g., epoxy resins), a photo-sensitive material such as polybenzoxazole (PBO), polyimide (PI) or benzocyclobutene (BCB), a combination thereof, or other suitable electrically insulating materials. The method of forming the insulating encapsulation 130 includes forming an insulating material (not shown) on the temporary carrier C covering the first semiconductor die 110 and the conductive elements 120, and performing a grinding process, a chemical mechanical polishing (CMP) process, or other planarization process to partially remove the insulating material until the top surfaces of the conductive elements 120 and the die connectors 110d of the first semiconductor die 110 are exposed. After the grinding process, a cleaning step is optionally performed, for example, to clean and remove the residues generated from the grinding process. However, the disclosure is not limited thereto, and the planarizing step may be performed through any other suitable techniques. After forming the insulating encapsulation 130 and the planarization process, the conductive elements 120 penetrates through the insulating encapsulation 130 with the top surfaces of the conductive elements 120 being exposed. In some embodiments, the conductive elements 120 may be referred to as through insulator vias (TIVs).

Referring to FIG. 2, a redistribution structure 140 is formed over and electrically connected to the first semiconductor die 110. In some embodiments, the redistribution structure 140 includes at least one patterned dielectric layer (e.g., 141, 143, 145 and 147) and at least one patterned conductive layer (e.g., 142, 144 and 146) based on the circuit design requirements. The patterned conductive layer (e.g., 142, 144 and 146) may include conductive features such as lines, vias, and pads, and may be formed by patterning and metallization techniques (e.g., lithography, etching, CMP, thin-film deposition, plating, damascene processing, etc.), or other suitable process. The patterned conductive layer 142 is physically and electrically connected to the die connectors 110d of the first semiconductor die 110 and the conductive elements 120. The patterned conductive layer 142 may penetrate through the patterned dielectric layer 141. The patterned conductive layer 144 is electrically connected to the patterned conductive layer 142 and penetrates through the patterned dielectric layer 143. The patterned conductive layer 146 is electrically connected to the patterned conductive layer 144 and penetrates through the patterned dielectric layer 145, and the patterned dielectric layer 147 covers the patterned conductive layer 146. Materials of the patterned dielectric layers 141, 143, 145 and 147 may include a photo-sensitive material such as polybenzoxazole (PBO), polyimide (PI), benzocyclobutene (BCB), a combination thereof, or the like. Materials of the patterned conductive layers 142, 144 and 146 may include copper, nickel, titanium, a combination thereof, or the like, and is formed by an electroplating process or other suitable deposition process. It is appreciated that the number of the patterned dielectric layers or the patterned conductive layers is not limited by the disclosure.

Referring to FIG. 2, the redistribution structure 140 includes a plurality of first conductive features 148 and a plurality of second conductive features 149 aside the first conductive features 148 located on the patterned dielectric layer 147. In some embodiments, the first and second conductive features 148, 149 that are located on the patterned dielectric layer 147 and connected to the underlying patterned conductive layer 146 may be considered as another patterned conductive layer of the redistribution structure 140. In some embodiments, the material for each of the first conductive features 148 and the second conductive features 149 includes copper, nickel, titanium, a combination thereof or the like, and may be formed by an electroplating process or other suitable deposition process. The first conductive features 148 and the second conductive features 149 may include micro bumps, conductive pads, metallization patterns, solder connectors, and/or the like. In some embodiments, the first conductive features 148 include under-ball metallurgy (UBM) pads for the subsequent ball-mounting process. In some embodiments, the first conductive features 148 are made of copper. In alternative embodiments, the first conductive features 148 may be multi-layered pads made of materials including titanium, nickel, copper, gold, palladium, alloys thereof, or the like. In some embodiments, the second conductive features 149 include micro bump pads for electrical connecting other semiconductor dies/devices. In some embodiments, compared with the first conductive features 148, the smaller size(s) of the second conductive features 149 allows for fine pitches of the second conductive features 149 and enables high-density connections. In some embodiments, the first conductive features 148 and the second conductive features 149 are defined by the same lithography reticle or photomask. In alternative embodiments, the first conductive features 148 and the second conductive features 149 are formed sequentially or by different patterning processes.

After forming the redistribution structure 140, a semiconductor structure (i.e. package structure) 100A including the first conductive features 148 and the second conductive features 149 is formed on the temporary carrier C as shown in FIG. 2. In some embodiments, the redistribution structure 140 formed at an outermost side OS of the semiconductor structure 100A may include a first zone for the displacement or disposition of a semiconductor die or a semiconductor device, a second zone surrounding the first zone and a third zone between the first and second zone. In some embodiments, the first zone is referred to as a die/device attach zone DAZ, while the second zone and the third zone are referred to as a ball/bump mounting zone BMZ and a keep-out zone KOZ. In some embodiments, the die/device attach zone DAZ may be designated for mounting one or more semiconductor dies. In some embodiments, the ball/bump mounting zone BMZ may be designated for mounting external connectors such as conductive bumps, BGA balls, or solder balls, and the keep-out zone KOZ is interposed between the die/device attach zone DAZ and the ball/bump mounting zone BMZ. These zones will be discussed in greater details later in other embodiments. For example, the second conductive features 149 are formed in the die attach zone DAZ, and the first conductive features 148 are formed in the ball mounting zone BMZ. In some embodiments, the region near an edge of the outermost one of the second conductive features 149 and a closest edge of the adjacent one of the first conductive features 148 may be viewed as the keep-out zone KOZ.

Figure 3:
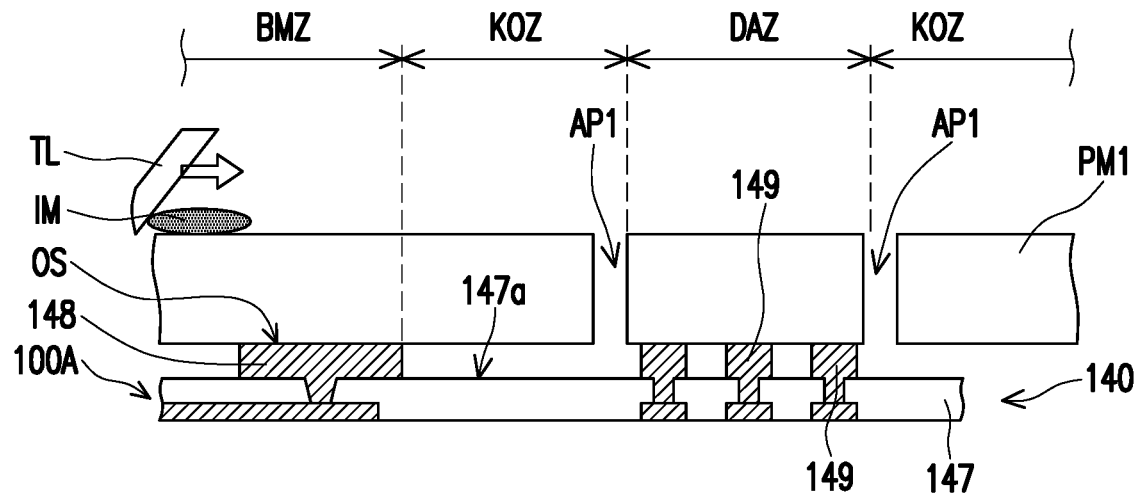
FIG. 3 to FIG. 8 are enlarged, schematic cross-sectional views illustrating the dashed region A of FIG. 2 and showing various stages in a method of forming a conductive terminal and disposing a semiconductor die on a semiconductor structure according to some exemplary embodiments of the present disclosure.
Figure 4:
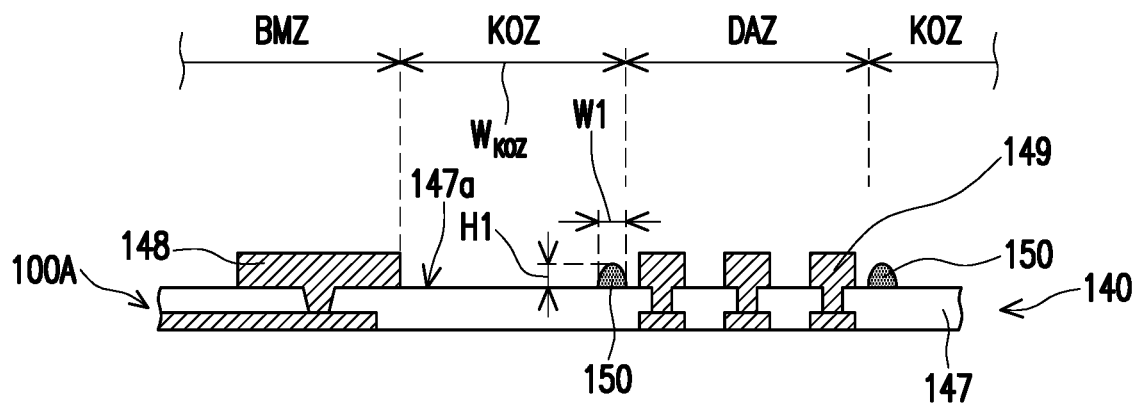

FIG. 3 to FIG. 8 are enlarged, schematic cross-sectional views illustrating the dashed region A of FIG. 2 and showing various stages in a method of forming a conductive terminal and disposing a semiconductor die on a semiconductor structure according to some exemplary embodiments of the present disclosure. Referring to FIG. 3 and FIG. 4, a first containment structure 150 is formed on the outermost side OS of the semiconductor structure 100A within the keep-out zone KOZ (e.g., a region immediately surrounding the die/device attach zone DAZ). A material of the first containment structure 150 may include polymer (e.g., epoxy resins, phenolic resins), solder resist, adhesive, metal, or other suitable barrier materials. In some alternative embodiments, the first containment structure 150 may be made of conductive paste (e.g., the mixture of conductive particles and binder). A suitable process such as printing, dispensing, spraying, or other applicable deposition process, is employed to form the first containment structure 150 depending on the applied materials. In some embodiments, a first patterned mask PM1 including a first aperture AP1 is overlaid on the redistribution structure 140. The first patterned mask PM1 may be a stencil (e.g., metal sheet) having the first aperture AP1 corresponding to the location of the keep-out zone KOZ. In some embodiments, the first aperture AP1 is positioned proximate to the edge of the outermost one of the second conductive features 149 within the keep-out zone KOZ. The first aperture AP1 of the first patterned mask PM1 may be formed as a pattern of closed loop such as rectangular ring shape, annular shape, a polygon ring shape, or the like.

For example, the first patterned mask PM1 directly leans against the first conductive features 148 and the second conductive features 149 to be close to a top surface 147a of the patterned dielectric layer 147, and the first patterned mask PM1 and the top surface 147a of the patterned dielectric layer 147 is spatially separated from each other. Next, a barrier material IM may be formed on the top surface 147a of the patterned dielectric layer 147 or a flat part of the first patterned mask PM1. In some embodiments, the barrier material IM includes an epoxy flux or other suitable materials. The epoxy flux may include epoxy and a flux component. In alternative embodiments, the barrier material IM may be conductive paste. For example, one or more tools (e.g., squeegee, blade, or wiper) TL may brush across the first patterned mask PM1 back and forth to apply the barrier material IM in the first aperture AP1 of the first patterned mask PM1. In some embodiments, a predetermined amount of barrier material IM is dispensed into the first aperture AP1 of the first patterned mask PM1 and a rounded surface is formed by surface tension.

In some embodiments, the barrier material IM is applied as a semi-fluid. Afterwards, the first patterned mask PM1 is removed, and the barrier material IM enclosing the second conductive features 149 is remained on the top surface 147a of the patterned dielectric layer 147. Subsequently, a curing process may be performed to solidify the barrier material IM so as to form the first containment structure 150. In some embodiments, conditions for curing the barrier material IM include subjecting the barrier material IM to a temperature of about 100° C. to about 180° C. for about 60 minutes. In certain embodiments, the curing temperature is between about 150° C. and about 160° C. for about 30 minutes. It is appreciated that the curing conditions may be adjusted depending on the design requirements, which is not limited thereto.

The first containment structure 150 may be formed as a dam structure or a wall structure in various cross-sectional shapes. In some embodiments, the first containment structure 150 is substantially an annular wall structure. While FIG. 4 shows a rounded (convex) top surface of the first containment structure 150, the top surface of the first containment structure 150 may have other shapes, including a flat surface, a concave surface, etc. The first containment structure 150 may include a width W1 in a range from about 20 micrometers (μm) to about 30 μm. A height H1 of the first containment structure 150 may range from about 20 μm to about 30 μm. The optimum size (e.g., width W1, height H1, etc.) of the first containment structure 150 is related to various factors, including the size of the second conductive features 149 and the size of a subsequently mounted component. In some embodiments, the height H1 of the first containment structure 150 is less than a thickness of each first conductive feature 148 (or a thickness of each the second conductive feature 149) on the top surface 147a of the patterned dielectric layer 147. In alternative embodiments, the height H1 of the first containment structure 150 is substantially equal to or greater than the thickness of each first conductive feature 148 (or the thickness of each the second conductive feature 149) on the top surface 147a of the patterned dielectric layer 147. It is appreciated that the values recited throughout the description are merely examples, and may be changed to different values.

Figure 5:
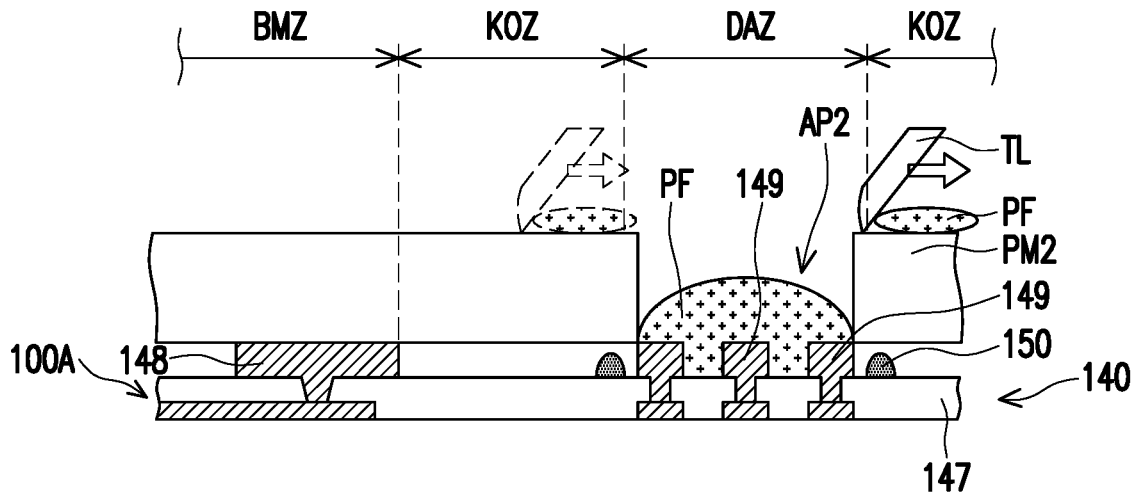

Referring to FIG. 5, a pre-fill material PF is formed on the top surface 147a of the patterned dielectric layer 147 within the die/device attach zone DAZ to cover the second conductive features 149. The pre-fill material PF may include polymer, epoxy resins, or suitable adhesive materials. For example, a second patterned mask PM2 including a second aperture AP2 is overlaid on the redistribution structure 140. The second aperture AP2 may expose the second conductive features 149 formed in the die/device attach zone DAZ. The size of the second aperture AP2 may depend on the size(s) of the subsequently mounted component (e.g., second semiconductor die 170 shown in FIG. 6). For example, a ratio of the opening area of the second patterned mask PM2 to the surface area of the subsequently mounted component is in the range from about 45% to about 65%. The second patterned mask PM2 may lean against the first conductive features 148 in the ball/bump mounting zone BMZ and may cover the first containment structure 150 in the keep-out zone KOZ. Next, the pre-fill material PF is applied over the second patterned mask PM2 and inside the second aperture AP2, and excess pre-fill material PF may be wiped out using tool TL. Afterwards, the second patterned mask PM2 is removed, the pre-fill material PF is left on the patterned dielectric layer 147 and covers the second conductive features 149.

Figure 6:
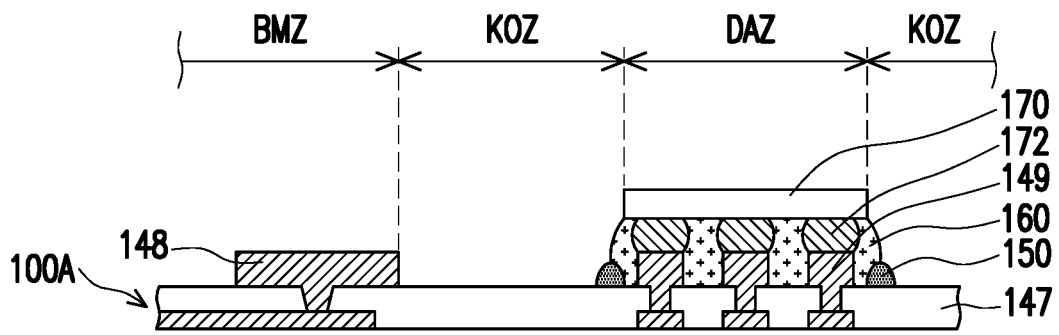

Referring to FIG. 6, a second semiconductor die 170 is disposed on the second conductive features 149 to electrically connect the semiconductor structure 100A. For example, the second semiconductor die 170 is picked and placed over the second conductive features 149 and the pre-fill material PF. The second semiconductor die 170 may be over and aligned to first semiconductor die 110 (shown in FIG. 2). Alternatively, the second semiconductor die 170 may be aligned to the insulating encapsulation 130 and/or the conductive elements 120 (shown in FIG. 2). In some embodiments, the second semiconductor die 170 includes conductive connectors 172, and after disposing the second semiconductor die 170, the conductive connectors 172 are distributed within the die/device attach zone DAZ. The second semiconductor die 170 is electrically connected to the second conductive features 149 through the conductive connectors 172. The conductive connectors 172 may include conductive pads/pillars, solder bumps, a combination thereof, or the like. In one embodiment, the conductive connectors 172 may be formed by printing a solder material over the second conductive features 149. One or more second semiconductor dies 170 may be disposed on the redistribution structure 140. It should be noted that a single second semiconductor die 170 is present in the figures for illustrative purposes, but the number of second semiconductor die 170 to be mounted on the redistribution structure 140 is not limited herein and can be varied based on design requirements. In some embodiments, one or more first semiconductor dies 110 may be programmed by one or more second semiconductor dies 170. For example, the second semiconductor die 170 may be used to tune the performance of the respective semiconductor device. In some embodiments, the second semiconductor die 170 is a discrete passive device that is not formed in a same die in which active devices (e.g., transistors and diodes) are formed. In some embodiments, the second semiconductor die 170 may be silicon (or ceramic) based with the passive device therein. For example, the second semiconductor die 170 may be free from active devices formed therein. The second semiconductor die 170 may include capacitors, resistors, inductors and/or the like. The second semiconductor die 170 may be integrated passive device (IPD), surface mount device (SMD), or other suitable package components.

In some embodiments, when mounting the second semiconductor die 170, the pre-fill material PF on the second conductive features 149 may be squeezed to extend outwardly from the die/device attach zone DAZ to the keep-out zone KOZ so as to form the pre-fill layer 160. For example, during disposing the second semiconductor die 170, excess pre-fill material PF may flow out of the die/device attach zone DAZ, and then the flow of the pre-fill material PF may spread out until reaching the first containment structure 150 so that the pre-fill layer 160 may be in physical contact with the first containment structure 150. In alternative embodiments, a less amount of pre-fill material is dispensed so that after disposing the second semiconductor die 170, the pre-fill layer 160 is distributed within the die/device attach zone DAZ without spreading out to the keep-out zone KOZ and may not be in contact with the first containment structure 150. After disposing the second semiconductor die 170, the conductive connectors 172 of the second semiconductor die 170 and the underlying second conductive features 149 are physically and electrically connected. The pre-fill layer 160 interposed between the second semiconductor die 170 and the redistribution structure 140 may encapsulate the conductive connectors 172 and the underlying second conductive features 149. The first containment structure 150 may be sized to block the pre-fill material PF spreading out of the keep-out zone KOZ. In some embodiments, the first containment structure 150 allows the pre-fill layer 160 underlying the second semiconductor die 170 to be positioned within the keep-out zone KOZ and allows the pre-fill layer 160 to fill the area enclosed by the first containment structure 150.

Figure 7:
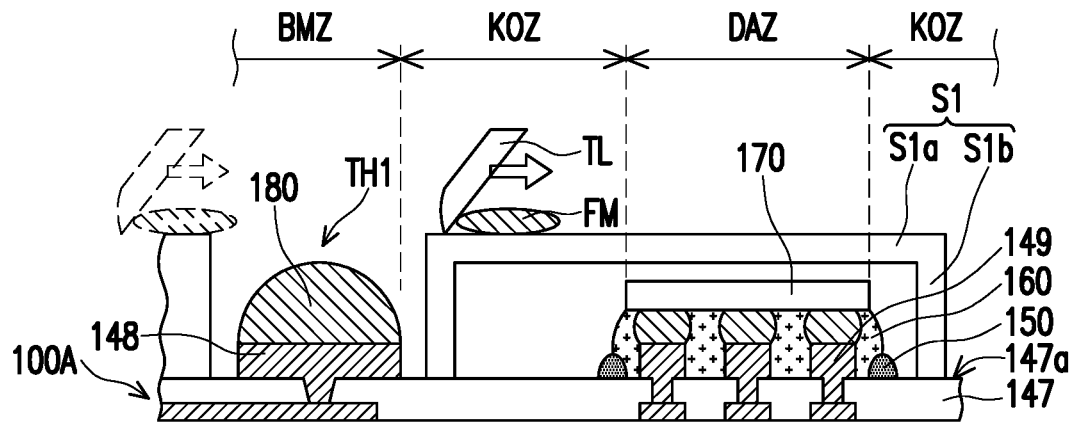
Figure 8:
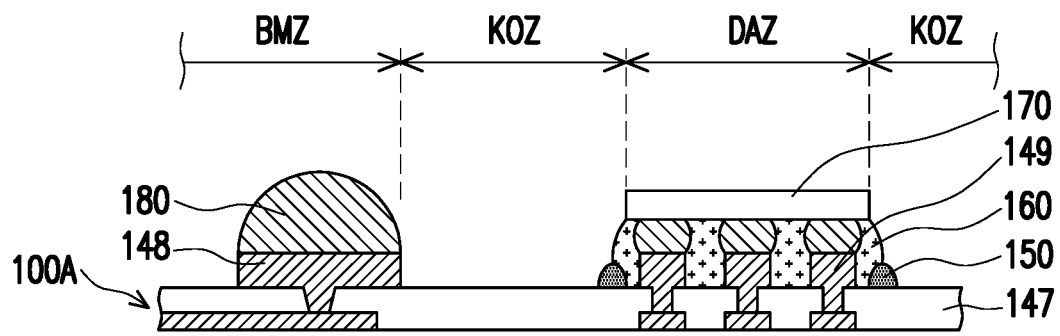

Referring to FIG. 7 and FIG. 8, a conductive terminal 180 is formed on the first conductive feature 148 to electrically connect the semiconductor structure 100A. The conductive terminal 180 may be disposed adjacent to the second semiconductor die 170. In some embodiments, a plurality of the conductive terminal 180 is arranged at locations corresponding to the locations of the first conductive features 148 within the ball/bump mounting zone BMZ. The conductive terminals 180 are physically and electrically connected to the first conductive features 148 of the redistribution structure 140 so that the second semiconductor die 170 and the first semiconductor die 110 are electrically coupled to the conductive terminals 180. In some embodiments, the conductive terminals 180 are made of a conductive material with low resistivity, such as solder, copper, aluminum, gold, nickel, silver, palladium, tin, an alloy thereof, or the like. The conductive terminals 180 may be ball grid array (BGA) connectors, solder balls, metal pillars, or the like.

In some embodiments, the conductive terminals 180 are formed by initially forming a layer of solder through methods such as ball drop, evaporation, electroplating, printing, or the like. For example, the ball placement process may include the following steps. A shielding structure S1 including a through hole TH1 is disposed over the top surface 147a of the patterned dielectric layer 147 to cover the second semiconductor die 170, the underlying pre-fill layer 160, and the first containment structure 150. The through hole TH1 of the shielding structure S1 may expose the first conductive features 148 in the ball/bump mounting zone BMZ. In some embodiments, the shielding structure S1 includes an upper cover S1a and sidewalls S1b connected to the upper cover S1a for covering the second semiconductor die 170 and the underlying pre-fill layer 160 within the first containment structure 150, and the sidewalls S1b may spatially isolate the first conductive features 148 from the adjacent first containment structure 150. For example, the first containment structure 150 may be a rectangular-shaped barrier structure which substantially surrounds the pre-fill layer 160 and the overlying second semiconductor die 170, and the shielding structure S1 having a retaining wall structure (e.g., including a rectangular framework which is fabricated from a top panel and partition panels) can protect the first containment structure 150 during processing.

After disposing the shielding structure S1, a flux material FM is applied onto the first conductive features 148 using a printing process or other suitable process before the disposal of conductive balls. Next, conductive balls (e.g., solder balls, gold balls, copper balls, nickel balls, or the like) are then placed over the shielding structure S1. For example, the conductive balls may be subjected to vibration such that the conductive balls are dropped into the through hole TH1 of the shielding structure S1, and the positions of the conductive balls may be confined by the through hole TH1 of the shielding structure S1. In some embodiments, the conductive balls may be placed directly on the flux material FM. Subsequently, the shielding structure S1 is removed, and a reflow process is performed. In some embodiments, a reflow process is performed to form conductive terminals 180 on the first conductive features 148 (e.g., function as UBM pads). For example, the reflow process helps to securely bond the conductive balls to the underlying first conductive features 148, and the flux material FM may not be seen after the reflow process. In some embodiments, the conductive connectors 172 of the second semiconductor die 170 and the conductive terminals 180 may be formed at the same time by printing a solder material on the second and the first conductive features 149, 148 and later reflowing. In alternative embodiments, the conductive terminals 180 may be formed on the first conductive features 148 before the second semiconductor die 170 is disposed on the second conductive features 148 of the redistribution structure 140.

Figure 9:
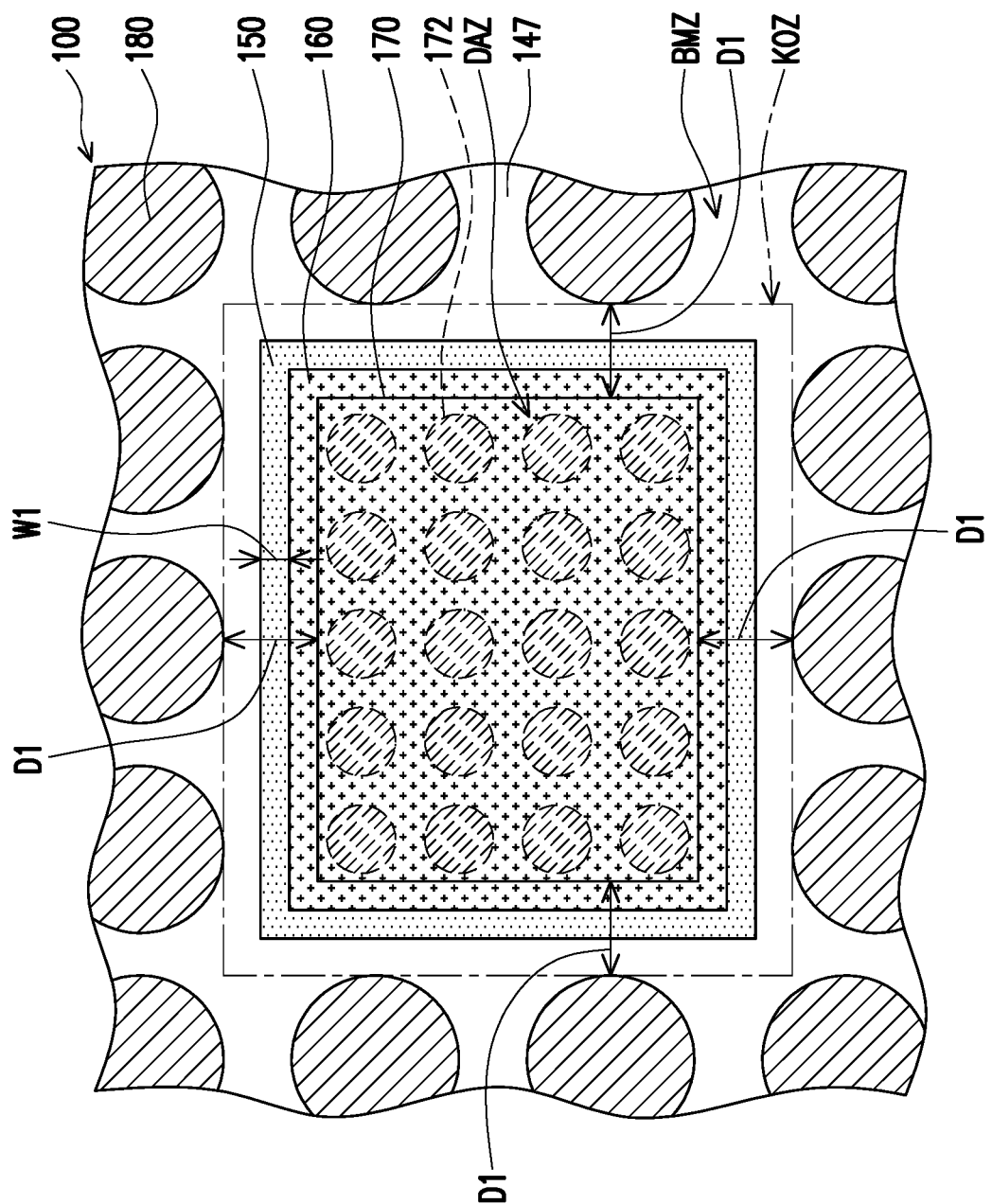
FIG. 9 is a simplified, schematic top view of FIG. 8 according to some exemplary embodiments of the present disclosure.

FIG. 9 is a simplified, schematic top view of FIG. 8 according to some exemplary embodiments of the present disclosure. Referring to FIG. 8 and FIG. 9, the keep-out zone KOZ may be sized so that a sufficient space exists between the conductive terminals 180 and the conductive connectors 172 of the second semiconductor die 170. In some embodiments, the keep-out zone KOZ may include a region in which an edge of one of the conductive terminals 180 is spaced apart from an edge of the second semiconductor die 170 by a keep-out distance D1. In some embodiments, the first containment structure 150 is disposed between each sidewall of the second semiconductor die 170 and a closest edge the adjacent one of the plurality of the conductive terminals 180. In some embodiments, the keep-out distances D1 between each sidewall of the second semiconductor die 170 to the closest edge of an adjacent conductive terminal 180 may be substantially equal. In some other embodiments, different keep-out distances may exist from one of the sidewalls of the second semiconductor die 170 to the closest edge of the adjacent one of conductive terminals 180 according to the layout requirements.

In some embodiments, a smaller keep-out distance D1 between a sidewall of the second semiconductor die 170 to the closest edge of an adjacent conductive terminal 180 is desirable because more second semiconductor dies 170 may be mounted on the semiconductor structure 100A. In some embodiments, a ratio of the keep-out distance D1 to the width W1 of the first containment structure 150 ranges from about 5 to about 7.5. It is appreciated that the values recited throughout the description are merely examples, and may be changed to different values. In order to prevent the pre-fill material PF applied on the second conductive features 149 from outflowing or even impacting the flux material FM applied on the first conductive features 148, the first containment structure 150 formed in the keep-out zone KOZ may restrict the flow of the pre-fill material PF so as to prevent bleeding out of excess pre-fill material PF to cause the interconnect defects and inspection failures so that the size requirements of the keep-out zone KOZ may be reduced and the distribution density of the conductive terminals 180 may be increased as a result.

Figure 10:
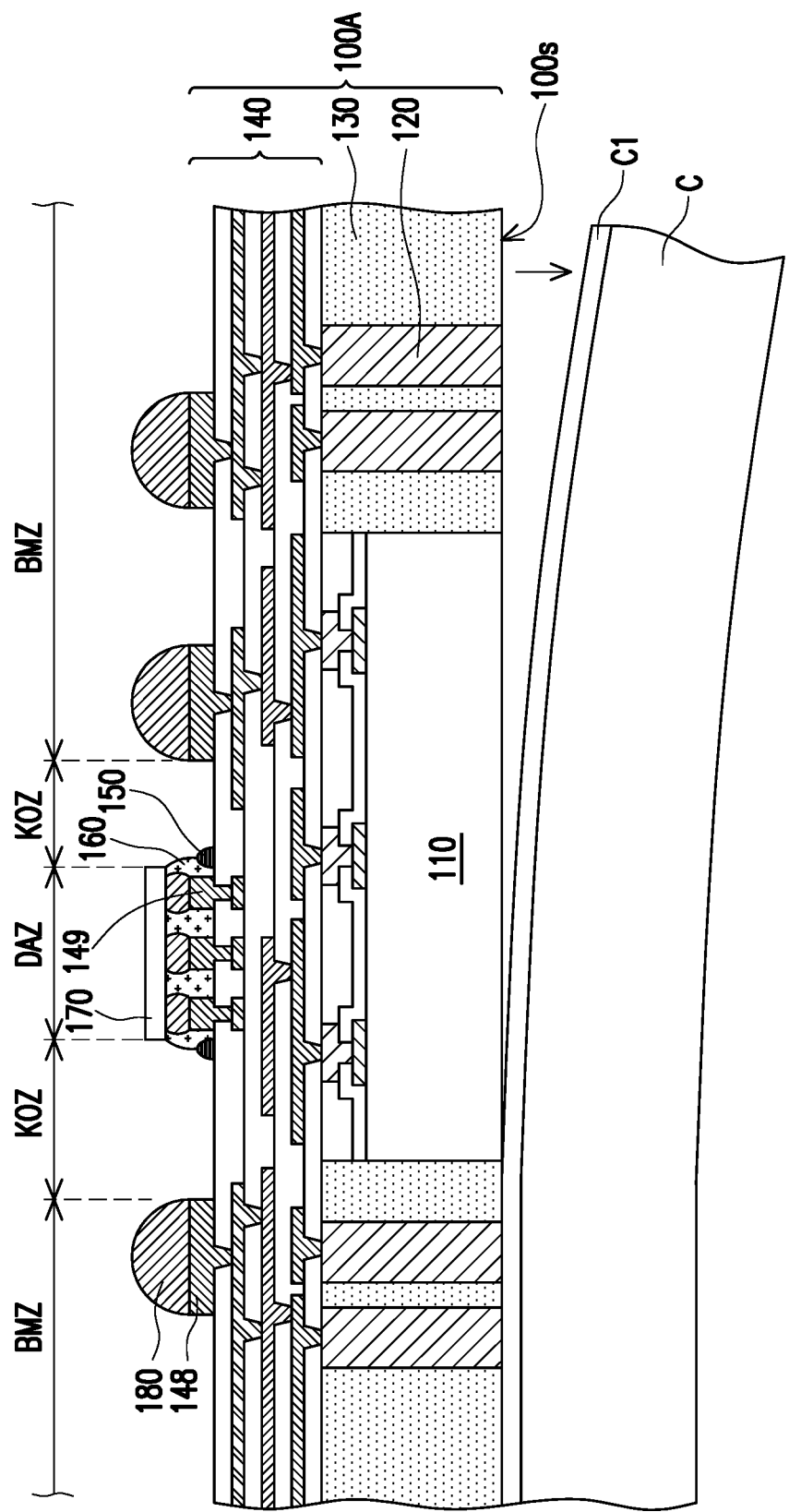
FIG. 10 and FIG. 11 are schematic cross-sectional views showing various stages in a manufacturing method of a semiconductor device according to some exemplary embodiments of the present disclosure.
Figure 11:
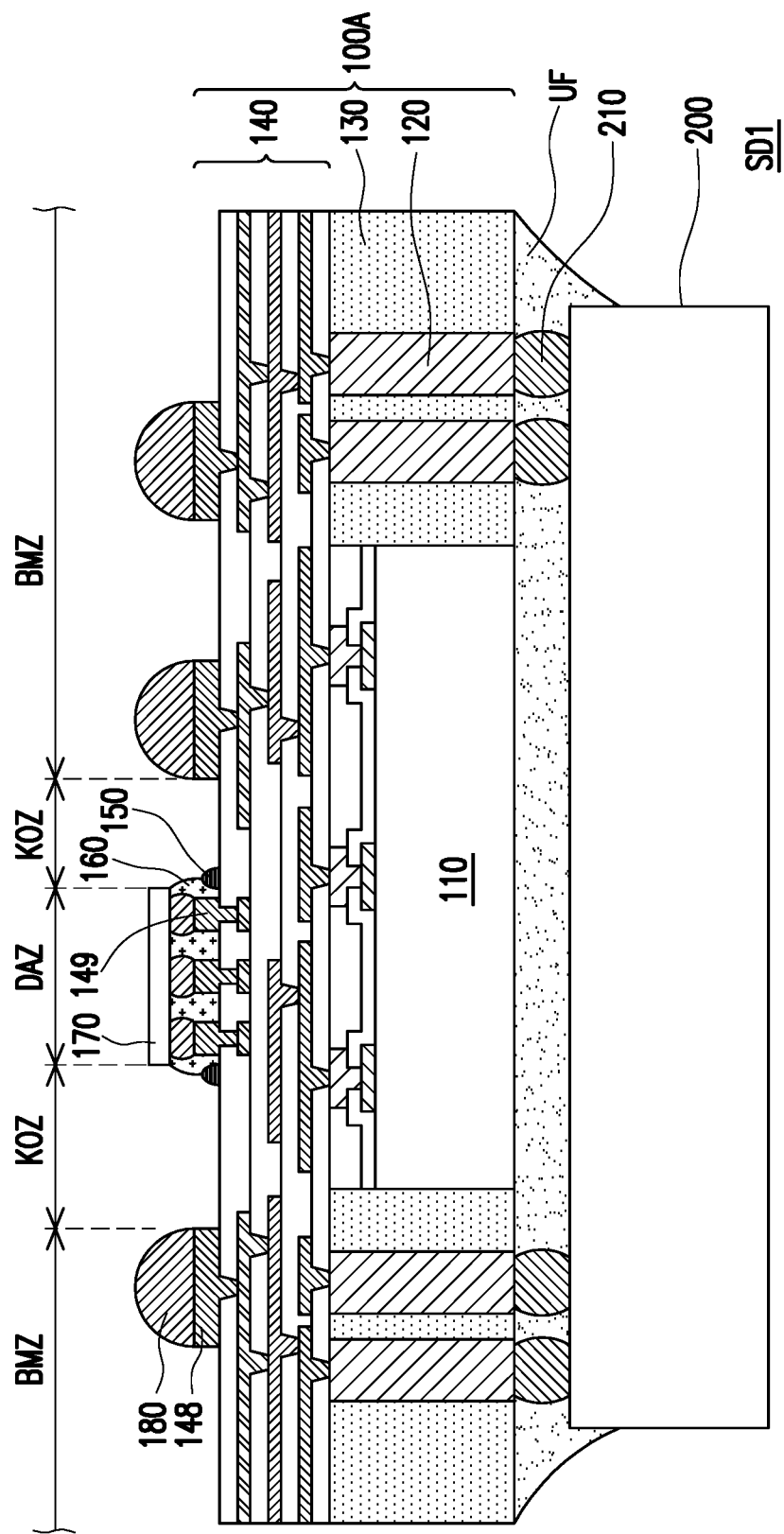

FIG. 10 and FIG. 11 are schematic cross-sectional views showing various stages in a manufacturing method of a semiconductor device according to some exemplary embodiments of the present disclosure. Referring to FIG. 10 and FIG. 11, after mounting the second semiconductor die 170 and forming the conductive terminals 180, the temporary carrier C may be separated from the insulating encapsulation 130, the first semiconductor die 110, and the conductive elements 120. In some embodiments, the temporary carrier C is de-bonded by irradiating the de-bonding layer C1 disposed over the temporary carrier C with UV or laser to expose a surface 100s of the semiconductor structure 100A. The surface 100s of the semiconductor structure 100A has portions of the conductive elements 120 exposed by the insulating encapsulation 130 for further electrical connection. For example, multiple integrated circuit packages may be stacked upon the semiconductor structure 100A to provide additional functionality in a package-on-package (POP) structure.

In some embodiments, a device package 200 is disposed on the surface 100s of the semiconductor structure 100A to form a semiconductor device SD1. The device package 200 is, for example, a memory device (e.g., static random access memory (SRAM), dynamic random access memory (DRAM), etc.) or other suitable semiconductor devices. The device package 200 may be stacked over and electrically connected to the semiconductor structure 100A through external terminals 210. In some embodiments, the external terminals 210 of the device package 200 are physically and electrically connected to the conductive elements 120 so that the device package 200 is electrically coupled to the first semiconductor die 110 and the second semiconductor die 170. In some embodiments, an underfill UF is formed between the semiconductor structure 100A and the device package 200. The underfill UF may be dispensed to cover at least the external terminals 210 for protection. In some embodiments, the underfill UF may cover the surface 100s of the semiconductor structure 100A and may wrap at least a bottom portion of the device package 200. In some embodiments, a singulation (dicing) process is then performed to cut though at least the underfill material UF, the insulating encapsulation 130, and the redistribution structure 140 along the cutting line (not shown) so as to form individual and separated semiconductor devices SD1. In some embodiment, the singulation process is a wafer dicing process including mechanical sawing or laser cutting.

Figure 12:
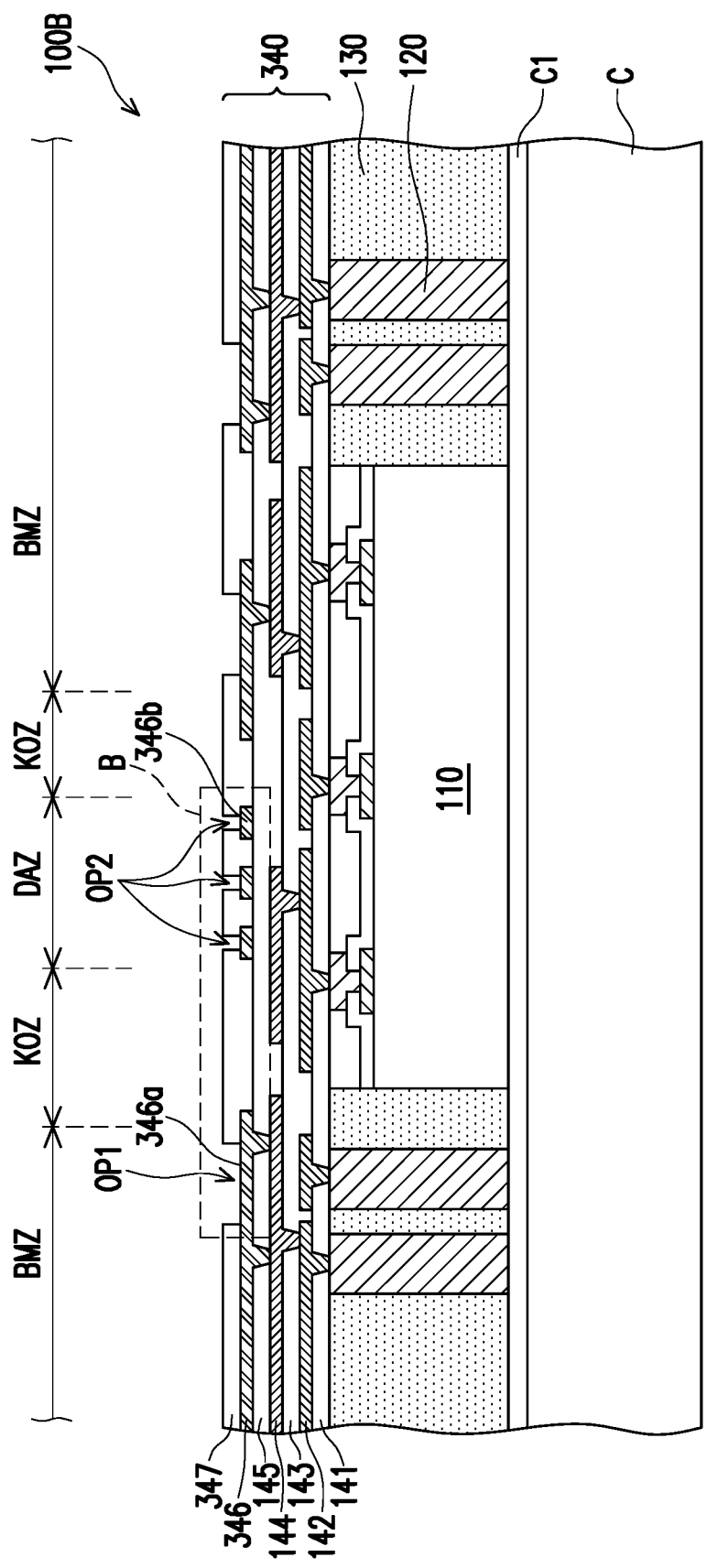
FIG. 12 is a schematic cross-sectional view showing a semiconductor structure according to some exemplary embodiments of the present disclosure.

FIG. 12 is a schematic cross-sectional view showing a semiconductor structure according to some exemplary embodiments of the present disclosure. The semiconductor structure 100B of FIG. 12 may be fabricated following the previously described manufacturing process as described in FIG. 1 and FIG. 2. The difference between the semiconductor structures 100A and 100B lies in the redistribution structure. Referring to FIG. 12, the patterned conductive layer 346 of the redistribution structure 340 is electrically connected to the patterned conductive layer 144 and penetrates through the patterned dielectric layer 145, and the patterned dielectric layer 347 partially covers the patterned conductive layer 346. The patterned conductive layer 346 may include first conductive features 346a and second conductive features 346b. For example, the patterned dielectric layer 347 includes first openings OP1 and second openings OP2. The first openings OP1 may expose the underlying first conductive features 346a, and the second openings OP2 may expose the underlying second conductive features 347b for further electrical connection.

Figure 13:
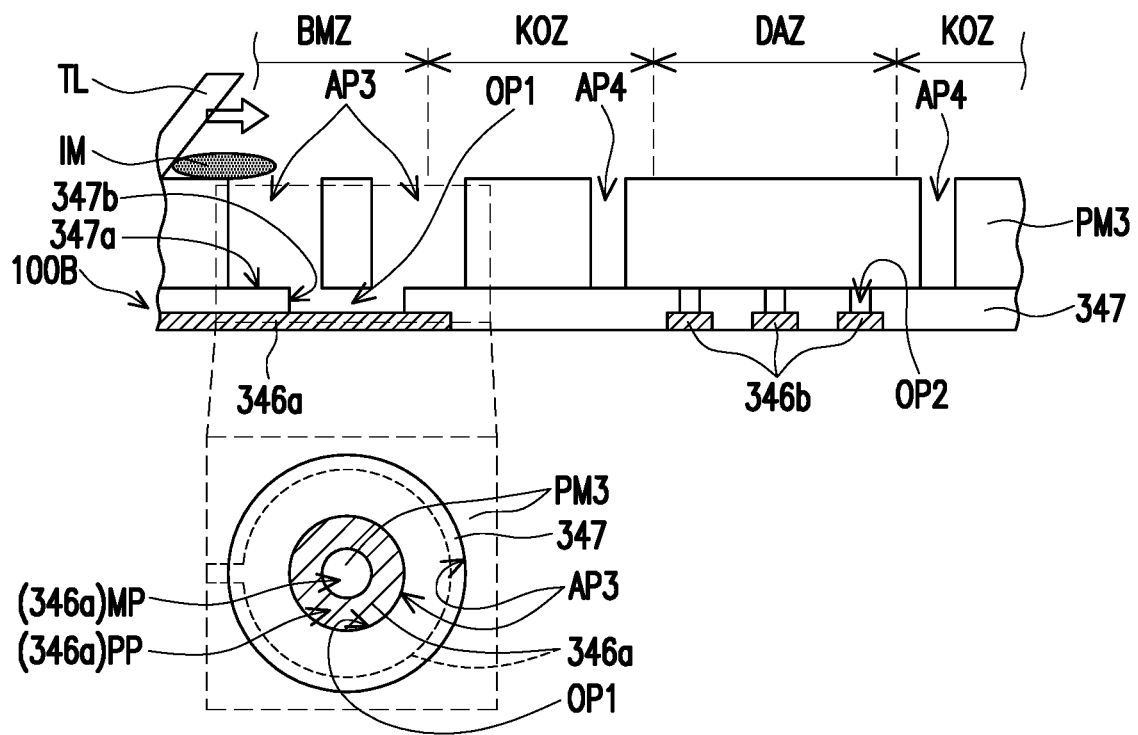
FIG. 13 to FIG. 18 are enlarged, schematic cross-sectional views illustrating the dashed region B of FIG. 12 and showing various stages in a method of forming a conductive terminal and disposing a semiconductor die on a semiconductor structure according to some exemplary embodiments of the present disclosure.

FIG. 13 to FIG. 18 are enlarged, schematic cross-sectional views illustrating the dashed region B of FIG. 12 and showing various stages in a method of forming a conductive terminal and disposing a semiconductor die on a semiconductor structure according to some exemplary embodiments of the present disclosure. Referring to FIG. 13, a third patterned mask PM3 including third apertures AP3 and fourth apertures AP4 is overlaid on the top surface 347a of the patterned dielectric layer 347. In some embodiments, the third patterned mask PM3 may be a stencil (e.g., metal sheet) having the third apertures AP3 substantially corresponding to at least the ball/bump mounting zone BMZ and the fourth apertures AP4 corresponding to the location of the keep-out zone KOZ. In some other embodiments, portion of the third apertures AP3 are disposed at the junction of the ball/bump mounting zone BMZ and the keep-out zone KOZ to expose both zones. For example, the third apertures AP3 may partially expose the first conductive features 346a of the patterned conductive layer 346. In some embodiments, the third patterned mask PM3 covers the second openings OP2 of the patterned dielectric layer 347. The dashed box in FIG. 13 illustrates a corresponding top down view of the third patterned mask PM3, the patterned dielectric layer 347, and the underlying first conductive features 346a. For example, regarding to the parts of the first conductive features 346a accessibly revealed by the first openings OP1 of the patterned dielectric layer 347, the third patterned mask PM3 covers the middle portions MP of the first conductive features 346a, and the third apertures AP3 of the third patterned mask PM3 expose the peripheral portions PP of the first conductive features 346a.

In some embodiments, the third apertures AP3 of the third patterned mask PM3 may be in communication with the first openings OP1 of the patterned dielectric layer 347 and may expose a top surface 347a and sidewalls 347b (e.g., connecting to the top surface 347a and the first conductive features 346a) of the patterned dielectric layer 347. In some embodiments, the fourth apertures AP4 are positioned proximate to the outermost one of the second openings OP2 of the patterned dielectric layer 347. The third apertures AP3 and/or the fourth apertures AP4 may be formed as a pattern of closed loop (e.g. rectangular ring shape, annular shape, a polygonal ring shape, or the like). After disposing the patterned mask PM3 to directly lean against the top surface 347a of the patterned dielectric layer 347, a barrier material IM may be formed on the top surface 347a of the patterned dielectric layer 347. For example, one or more tools (e.g., squeegee, blade, or wiper) TL may brush across the third patterned mask PM3 back and forth to apply the barrier material IM in the third apertures AP3 and the fourth apertures AP4 of the third patterned mask PM3.

Figure 14:
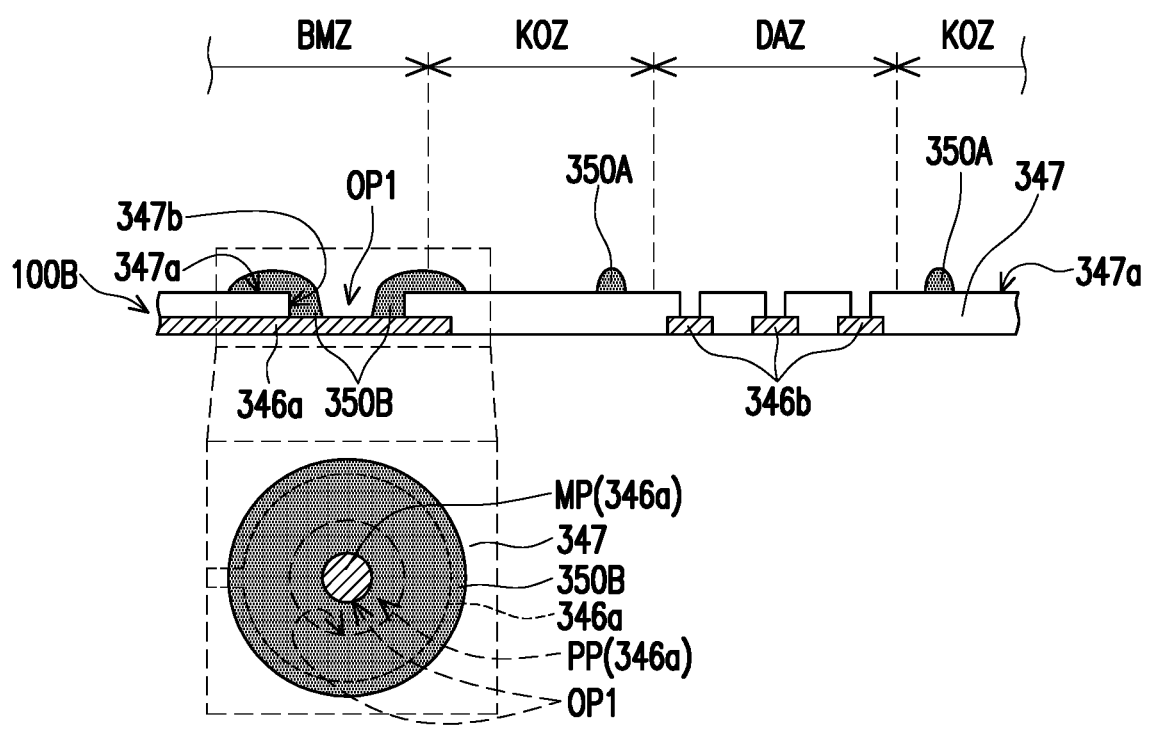

Referring to FIG. 14, the third patterned mask PM3 is removed, and two groups of the barrier material IM respectively enclosing the first openings OP1 and the second openings OP2 are remained on the top surface 347a of the patterned dielectric layer 347. In some embodiments, the barrier material IM is applied as a semi-fluid, part of the barrier material IM applied on the top surface 347a of the patterned dielectric layer 347 may flow downwardly to cover the sidewalls 347b of the patterned dielectric layer 347 and reach at least the peripheral portions PP of the first conductive features 346a revealed by the first openings OP1 of the patterned dielectric layer 347. A curing process may be performed to solidify the barrier material IM so as to form a first containment structure 350A around those second openings OP2 and also form second containment structures 350B around each of the first openings OP1. The dashed box in FIG. 14 illustrates a corresponding top down view of the first containment structure 350B, the patterned dielectric layer 347, and the underlying first conductive features 346a. While FIG. 14 shows rounded (convex) top surfaces of the first containment structure 350A and the second containment structure 350B due to surface tension, the top surfaces of the first containment structure 350A and the second containment structures 350B may have other shapes, including flat surfaces, concave surfaces, etc. It should be appreciated that single second containment structure 350B shown in the figures merely serves as an illustrative example; a plurality of second containment structure 350B may be formed on portions (or each) of the first conductive features 346a for the subsequent ball mount process.

The curing process may be the similar process with the process described in FIG. 3 and FIG. 4, and the curing conditions may be adjusted depending on the design requirements to form the first containment structure 350A and the second containment structures 350B. The first containment structure 350A is connected to the top surface 347a of the patterned dielectric layer 347, and the second containment structure 350B may be in physical contact with the top surface 347a and the sidewalls 347b of the patterned dielectric layer 347 and also the peripheral portions PP of the first conductive features 346a revealed by the first openings OP1 of the patterned dielectric layer 347. The middle portions MP of the first conductive features 346a are exposed by the second containment structure 350B and the first openings OP1 of the patterned dielectric layer 347. In some embodiments, the first containment structure 350A and the second containment structure 350B are made of the electrically isolating material. In some alternative embodiments, the first containment structure 350A and the second containment structures 350B are made of different materials and using different patterned masks. For example, the second containment structures 350B may be made of conductive materials (e.g., solder, copper, etc.) and the first containment structure 350A may be made of electrically insulting materials. In alternative embodiments, both of the first containment structure 350A and the second containment structures 350B are made of conductive paste.

Figure 15:
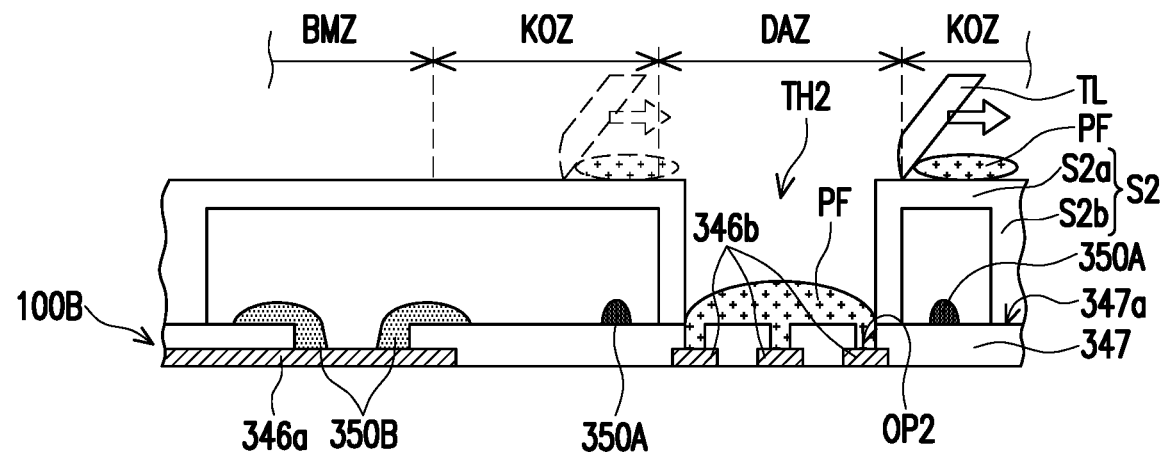

Referring to FIG. 15, a first shielding structure S2 is disposed over the top surface 347a of the patterned dielectric layer 347 to cover the first containment structure 350A and the second containment structure 350B in the keep-out zone KOZ and the ball/bump mounting zone BMZ. The first shielding structure S2 may include a through hole TH2 exposing the second openings OP2 of the patterned dielectric layer 347 within the die/device attach zone DAZ. In some embodiments, the first shielding structure S2 includes an upper cover S2a and sidewalls S2b connected to the upper cover S2a. The first containment structure 350A and the second containment structure 350B covered by the first shielding structure S2 are spatially separated from the upper cover S2a and the sidewalls S2b. After disposing the first shielding structure S2, the pre-fill material PF is applied in the through hole TH2 of the first shielding structure S2 so that the pre-fill material PF is formed on the top surface 347a of the patterned dielectric layer 347 and inside the second openings OP2 the patterned dielectric layer 347 within the die/device attach zone DAZ to cover the second conductive features 346b.

Figure 16:
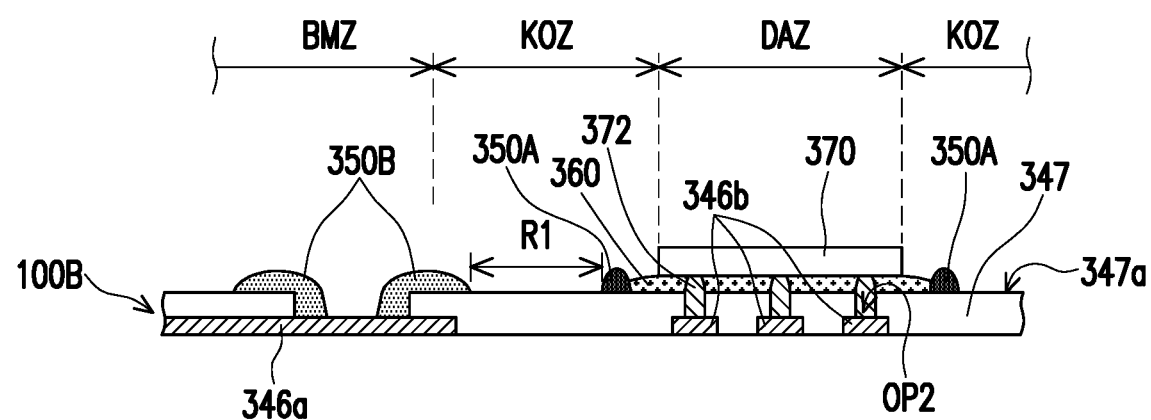

Referring to FIG. 16, after forming the pre-fill material PF on the second conductive features 346b, the second semiconductor die 370 may be disposed on the second conductive features 346b with the pre-fill layer 360 formed in between. In some embodiments, when disposing the second semiconductor die 370, the pre-fill material PF on the second conductive features 149 may be squeezed to extend outwardly from the die/device attach zone DAZ to the keep-out zone KOZ so as to form the pre-fill layer 360. The conductive connectors 372 of the second semiconductor die 370 may be correspondingly connected to the second conductive features 346b. In some embodiments, the bottom portions of the conductive connectors 372 of the second semiconductor die 370 may be encapsulated by the patterned dielectric layer 347 and the top portion of the conductive connectors 372 may be encapsulated by the pre-fill layer 360. In some embodiments, the flow of the pre-fill material PF may spread out until reaching the first containment structure 350 so that the pre-fill layer 360 may be in physical contact with the first containment structure 350. In alternative embodiments, a less amount of pre-fill material PF is dispensed so that after disposing the second semiconductor die 370, the pre-fill layer 360 is distributed within the die/device attach zone DAZ and may not be in contact with the first containment structure 350A. In some embodiments, a sufficient distance R1 exists between the outer edge of the first containment structure 350A and the closest edge the adjacent one of the second containment structures 350B. For example, the distance R1 is in a range from about 80 µm to about 100 µm.

Figure 17:
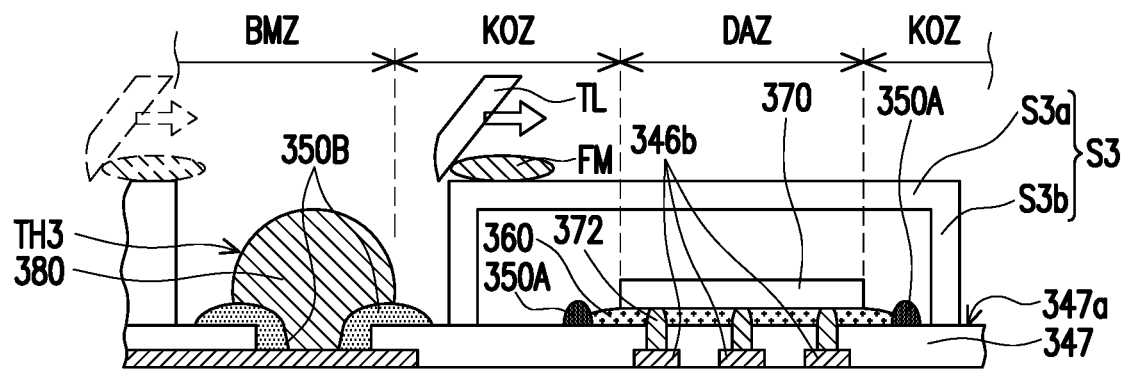
Figure 18:
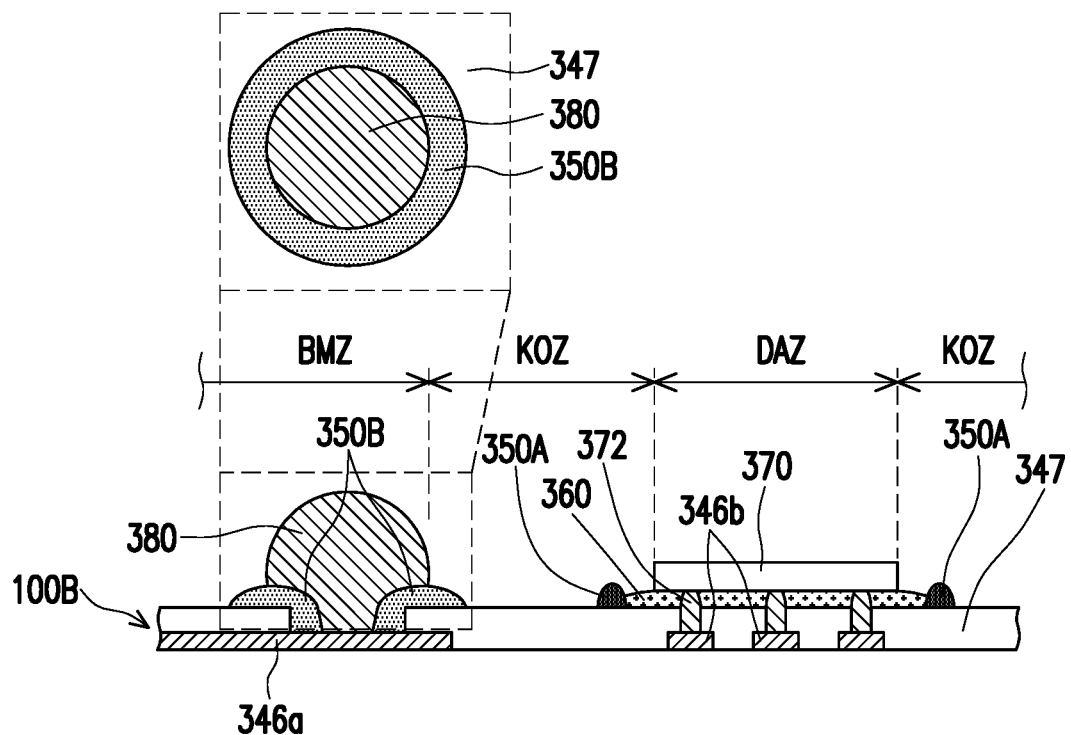

Referring to FIG. 17 and FIG. 18, a second shielding structure S3 is disposed over the top surface 347a of the patterned dielectric layer 347 to cover the first containment structure 350A, the second semiconductor die 370 and the underlying pre-fill layer 360. The second shielding structure S3 may include a through hole TH3 exposing the second containment structure 350B. In some embodiments, the second shielding structure S3 includes an upper cover S3a and sidewalls S3b connected to the upper cover S3a. The first containment structure 350A and the second semiconductor die 370 covered by the second shielding structure S3 are spatially separated from the upper cover S3a and the sidewalls S3b. In some embodiments, the sidewalls S3b may be disposed between the first containment structure 350A and the second containment structure 350B to space apart therebetween. After disposing the second shielding structure S3, the flux material FM is formed on the first conductive features 346a of the patterned conductive layer 346 exposed by the second containment structure 350B and the patterned dielectric layer 347 using a printing process or other suitable process before the disposal of conductive balls. Next, the conductive balls are then disposed over the second shielding structure S3 and dropped into the through hole TH3 of the second shielding structure S3 to form the conductive terminals 380.

Subsequently, the second shielding structure S3 is removed, and a reflow process is optionally performed on the conductive terminals 380 and the conductive connectors 372 of the second semiconductor die 370 to enhance the attachment. The formation of the conductive terminals 380 may be similar with the process described in FIGS. 7 and 8, and the detailed descriptions are omitted for brevity. In some embodiments, the conductive terminals 380 may be made of solder material, and the second containment structures 350B may constrain the flow of the solder material and may prevent solder material from spreading out to interfere with one another or contaminate adjacent portions of the semiconductor structure 100B. The first containment structure 350A may obstruct the pre-fill material before it overflows towards the ball/bump mounting zone BMZ. The dashed box in FIG. 18 illustrates a corresponding top down view of the conductive terminal 350 and the second containment structure 350B. In some embodiments, the second containment structure 350B (e.g., as annular or ring shaped) may encircle the conductive terminal 350. The underlying second containment structure 350B may be of various shapes such as an annular, a ring, a rectangle, a square, a polygon, an oval, a diamond shape, or other suitable shapes.

Figure 19:
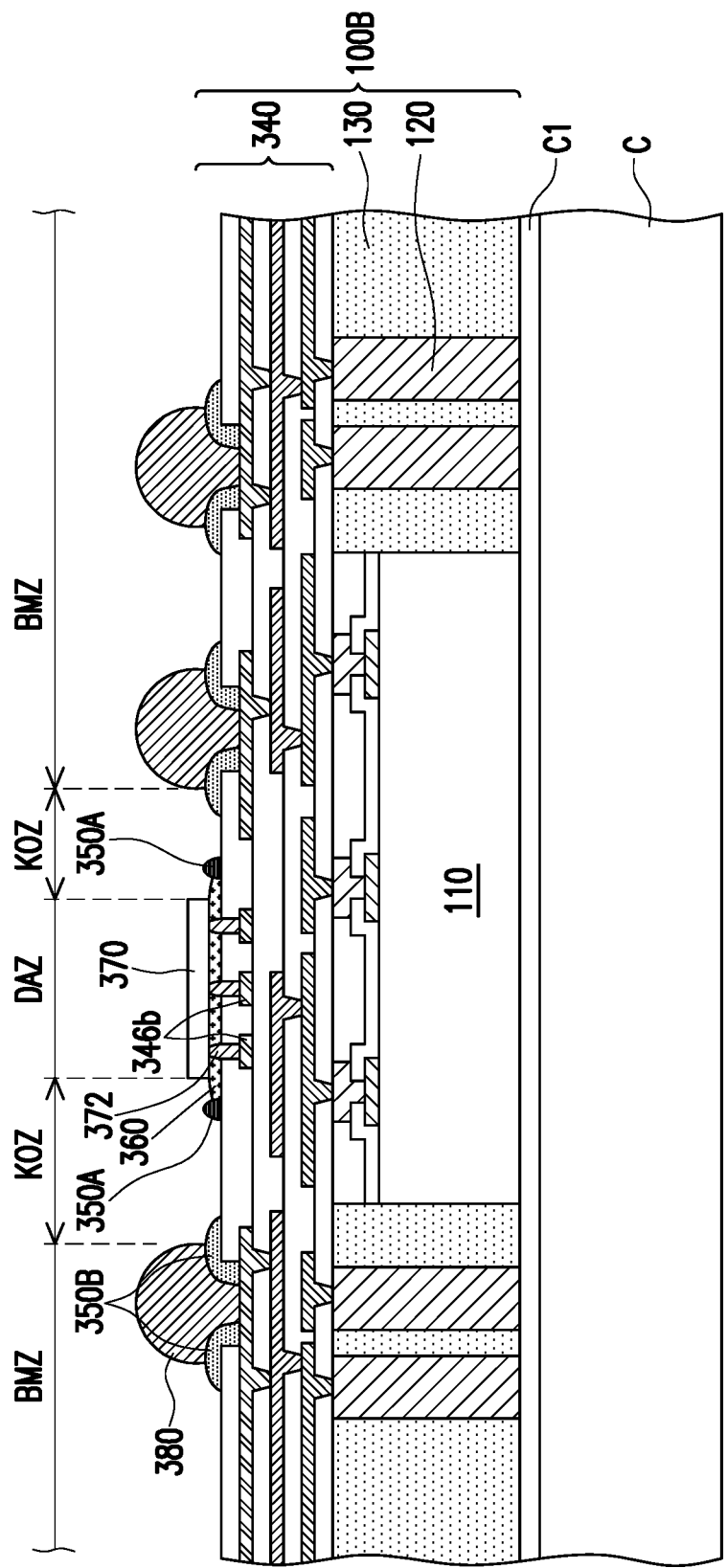
FIG. 19 and FIG. 20 are schematic cross-sectional views showing various stages in a manufacturing method of a semiconductor device according to some exemplary embodiments of the present disclosure.
Figure 20:
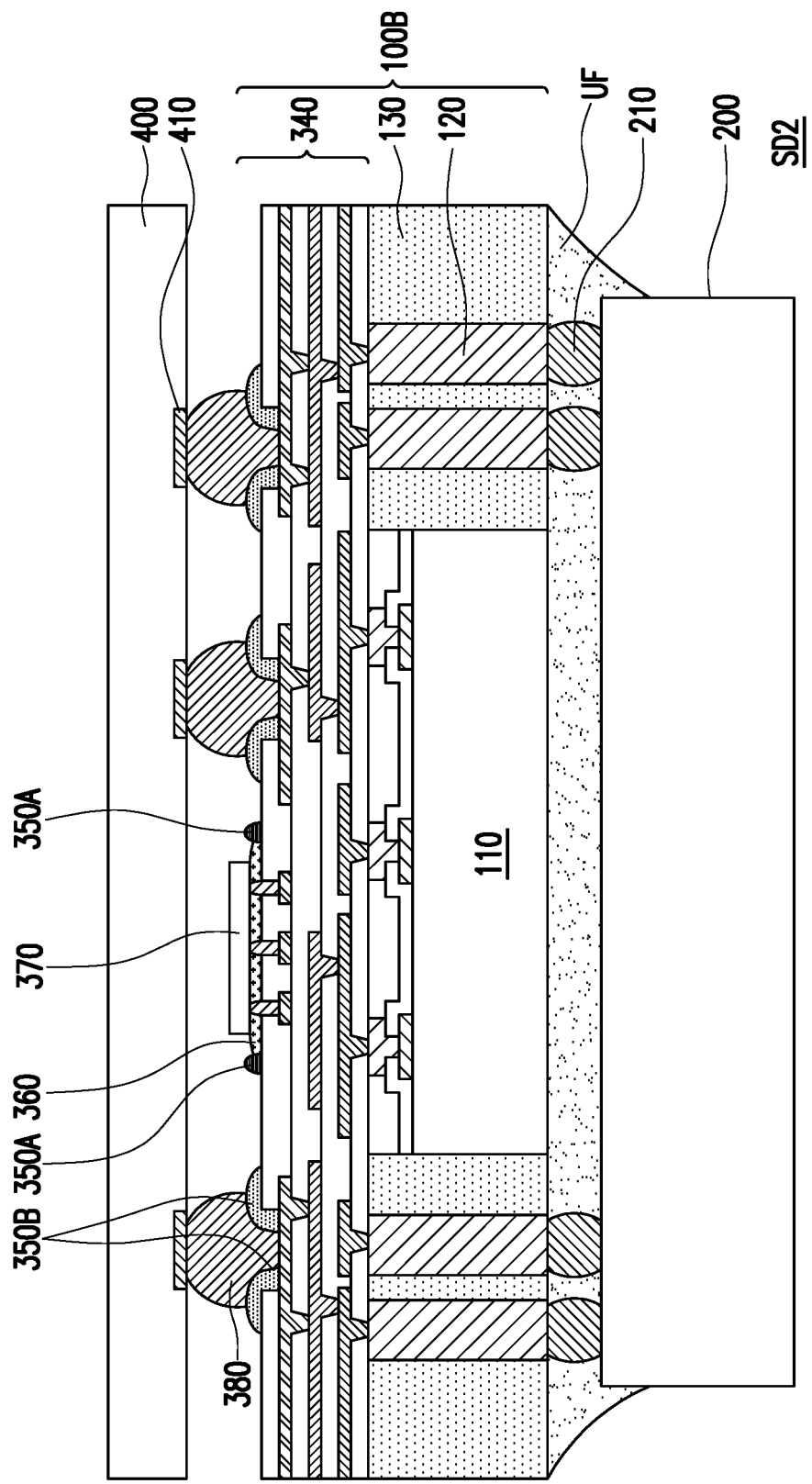

FIG. 19 and FIG. 20 are schematic cross-sectional views showing various stages in a manufacturing method of a semiconductor device according to some exemplary embodiments of the present disclosure. Referring FIG. 19, after mounting the second semiconductor die 370 and forming the conductive terminals 380, the temporary carrier C may be separated from the insulating encapsulation 130, the first semiconductor die 110, and the conductive elements 120. The removal of the temporary carrier C may be similar with the process described in FIG. 10, and the detailed descriptions are omitted for brevity. In some embodiments, a singulation (dicing) process is performed to cut though the insulating encapsulation 130 and the redistribution structure 340 along the cutting line (not shown) so as to form individual and separated semiconductor devices. The first containment structure 350A and/or the second containment structure 350B may be formed on a system on a-chip (SOC), a system on integrated circuit (SOIC) devices, or other applicable package devices. Such package devices having the first containment structure 350A and/or the second containment structure 350B formed thereon can be physically and electrically coupled with a printed wiring board or printed circuit board to form an electronic assembly. The electronic assembly can be part of an electronic system such as computers, wireless communication devices, computer-related peripherals, entertainment devices, or the like.

Referring to FIG. 20, the device package 200 and a package component 400 may be respectively mounted at the opposite sides of the semiconductor structure 100B and may be electrically connected to the semiconductor structure 100B. In some embodiments, the external terminals 210 of the device package 200 are physically and electrically connected to the conductive elements 120 so that the device package 200 is electrically coupled to the first semiconductor die 110 and the second semiconductor die 370. The underfill UF may be formed between the semiconductor structure 100B and the device package 200 for protection. The semiconductor structure 100B may be connected to the package component 400 through the conductive terminals 380. The second semiconductor die 370 may be interposed between the package component 400 and the semiconductor structure 100B. The package component 400 may be, for example, a printed circuit board (PCB), a device package, an interposer, or another types of package component. In some embodiments, the package component 400 may include conductive interconnections 410 (e.g., including pads, conductive traces, vias, or the like) built inside package component 400. The conductive terminals 380 may be joined to the conductive interconnections 410 in package component 400 so as to electrically connected therebetween.

According to some embodiments, a semiconductor device includes a package structure, a first die, a first containment structure, a pre-fill layer, and a plurality of conductive terminals. The package structure includes an attach zone, a keep-out zone around the attach zone. The first die is disposed on the package structure in the attach zone and electrically connected to the package structure. The first containment structure is disposed within the keep-out zone of the package structure and surrounds the first die. The pre-fill layer is disposed between the package structure and the first die and between the first containment structure and the first die, where the pre-fill layer is constrained within the first containment structure. The conductive terminals are disposed on the package structure, distributed around the keep-out zone of the package structure, and electrically connected to the package structure.

According to some embodiments, a semiconductor device includes a first die, an insulating encapsulation encapsulating the first die, a redistribution structure disposed on the insulating encapsulation and the first die, a second die disposed on the redistribution structure opposite to the first die and electrically coupled to the first die through the redistribution structure, a pre-fill layer filling between the second die and the redistribution structure, and a first containment structure disposed on the redistribution structure. The pre-fill layer is disposed between the first containment structure and the second die and enclosed by the first containment structure.

According to some embodiments, a manufacturing method of a semiconductor device is provided. A package structure is provided, where the package structure includes a first zone, a second zone surrounding the first zone, and a third zone between the first zone and the second zone. A first containment structure is formed on the package structure within the third zone. A semiconductor die is disposed on the first zone of the package structure with a pre-fill layer in between, where the first containment structure blocks outward flow of the pre-fill layer. A first shielding structure is disposed on the package structure to cover the first containment structure and the semiconductor die, where the second zone of the package structure is exposed by the first shielding structure. A conductive terminal is formed in the second zone of the package structure exposed by the first shielding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a package structure, comprising an attach zone and a keep-out zone around the attach zone;
   a first die, disposed on the package structure and in the attach zone and electrically connected to the package structure;
   a first containment structure, disposed within the keep-out zone of the package structure and surrounding the first die;
   a pre-fill layer, disposed between the package structure and the first die and between the first containment structure and the first die, wherein the pre-fill layer is constrained within the first containment structure; and
   a plurality of conductive terminals, disposed on the package structure, distributed around the keep-out zone of the package structure, and electrically connected to the package structure.

2. The semiconductor device of claim 1, wherein the package structure further comprises:
   a second die;
   an insulating encapsulation, laterally encapsulating the second die; and
   a redistribution structure, disposed on the insulating encapsulation and the second die, electrically connected to the second die and the plurality of conductive terminals.

3. The semiconductor device of claim 1, wherein the first containment structure is disposed between a sidewall of the first die and a closest edge of the adjacent one of the plurality of conductive terminals.

4. The semiconductor device of claim 1, wherein a ratio of a distance of the keep-out zone of the package structure to a width of the first containment structure ranges from about 5 to about 7.5.

5. The semiconductor device of claim 1, further comprising:
   a second containment structure, disposed on the package structure and surrounding at least one of the plurality of conductive terminals, wherein the second containment structure is sandwiched between the at least one of the plurality of conductive terminals and the package structure.

6. The semiconductor device of claim 5, wherein the package structure further comprises:
   a patterned dielectric layer, covering a patterned conductive layer and exposing portions of the patterned conductive layer, wherein the second containment structure is disposed on the patterned dielectric layer and the patterned conductive layer and covers sidewalls of the patterned dielectric layer.

7. A semiconductor device, comprising:
   a first die;
   an insulating encapsulation, encapsulating the first die;
   a redistribution structure, disposed on the insulating encapsulation and the first die;
   a second die, disposed on the redistribution structure opposite to the first die and electrically coupled to the first die through the redistribution structure;
   a pre-fill layer, filling between the second die and the redistribution structure; and
   a first containment structure, disposed on the redistribution structure, wherein the pre-fill layer is disposed between the first containment structure and the second die and enclosed by the first containment structure.

8. The semiconductor device of claim 7, further comprising:
   a conductive terminal, disposed on the redistribution structure and electrically connected to the redistribution structure, wherein the first containment structure is disposed between the second die and the conductive terminal.

9. The semiconductor device of claim 8, wherein the redistribution structure comprises a patterned dielectric layer and a patterned conductive layer embedded in the patterned dielectric layer, and the conductive terminal is disposed on the patterned dielectric layer and connected to the patterned conductive layer.

10. The semiconductor device of claim 9, further comprising:
   a second containment structure, disposed on the patterned dielectric layer and the patterned conductive layer, covering sidewalls of the patterned dielectric layer.

11. The semiconductor device of claim 10, wherein the second containment structure surrounds the conductive terminal and is sandwiched among the conductive terminal, the patterned dielectric layer, and the patterned conductive layer of the redistribution structure.

12. The semiconductor device of claim 10, wherein the first containment structure and the second containment structure are made of an electrically insulating material.

13. The semiconductor device of claim 10, wherein at least one of the first containment structure and the second containment structure is made by a conductive paste.

* * * * *